United States Patent [19]
Gut

[11] Patent Number: 5,600,681
[45] Date of Patent: Feb. 4, 1997

[54] METHOD AND EQUIPMENT FOR THE RECEPTION OF DIGITAL SIGNALS

[75] Inventor: Max B. Gut, Ahornweg 15, CH-6353 Weggis, Switzerland

[73] Assignee: Max B. Gut, Weggis, Switzerland

[21] Appl. No.: 204,490

[22] Filed: Mar. 2, 1994

[30] Foreign Application Priority Data

Mar. 5, 1993 [CH] Switzerland ..................... 00654/93

[51] Int. Cl.$^6$ ............................................. H04L 27/08
[52] U.S. Cl. ...................... 375/345; 375/316; 455/234.1
[58] Field of Search ......................... 375/98, 75, 76; 330/254; 455/234.1

[56] References Cited

U.S. PATENT DOCUMENTS

| 3,671,867 | 6/1972 | Schwarz | 375/98 |
| 3,898,380 | 8/1975 | Wilcox | 375/98 |
| 3,936,599 | 2/1976 | Peil et al. | 375/98 |

Primary Examiner—Stephen Chin
Assistant Examiner—T. Ghebretinsae
Attorney, Agent, or Firm—McCormick, Paulding & Huber

[57] ABSTRACT

With this method and equipment the sensitivity of receivers, whose gain control criterion is a constant noise signal level, can be controlled independently of the received data signal, so that the reception of long datastreams is possible. For this purpose a diode (D1) is provided, whose anode is connected to a voltage source, and whose cathode is connected with a current source (Q4) and with the cathode of a second diode (D2) whose anode is connected to a capacitor (C12). A voltage is applied across the capacitor (C12) which is smaller in the rest state than a second voltage applied via the first diode (D1), so that the second diode (D2) is reverse-biased. After reception of a data signal a discharge pulse (EP) is generated dependent on an output of a signal detector, through which the second voltage is reduced to a value that is smaller than the first voltage. In this way the capacitor (C12) is discharged to an extent such that the charge removed corresponds to the charge given to the capacitor (C12) during reception of a data signal.

15 Claims, 7 Drawing Sheets

METHOD AND EQUIPMENT FOR THE RECEPTION OF DIGITAL SIGNALS

BACKGROUND OF THE INVENTION

The invention concerns a method and equipment for the reception of digital signals in the form of impulses consisting of bursts of oscillations. With the method, the received signals are first filtered and amplified and are then taken to a signal detector followed by a noise suppression circuit, whereby the signal detector generates an output signal after reception of a signal. It is presupposed that in order to achieve automatic gain control, data and noise signals charge a capacitor in such a way that, when few signals exceed a given threshold level and the charge is correspondingly low, the sensitivity increases, and when many signals exceed the said threshold level and the charge is correspondingly greater, the sensitivity is reduced.

The receiver element of the type U 2506 B from AEG Telefunken is a known circuit which is available on the market in monolithic integrated form. The digital signals to be received are impulses in the form of bursts of oscillations which are modulated using Pulse Position Modulation, and which are taken to an input stage. The signals are then amplified and pass through a high pass filter, with which strong suppression of low frequency noise signals is achieved. After repeated amplification the signals are taken to a low pass filter and are then amplified again. The signals, greatly amplified in this way, are connected to a pulse counter circuit. This consists basically of three comparators connected one after the other, and generates a pulse after reception of a minimum number of oscillations. This pulse is transmitted to a pulse former stage, which as a result generates an output signal of constant duration that represents the useful data signal and whose position in time corresponds to the received signal.

Reception is made insensitive to noise by reducing the amplification in a noise suppression circuit and a circuit for automatic gain control (AGC) in the aforementioned apparatus. With this automatic gain control, the sensitivity rises when few of the received signals exceed a threshold level, but with increasing sensitivity more noise signals come to effect so that the sensitivity must be reduced again. In this way the noise level at the input of the pulse counter stage is kept virtually constant and the sensitivity is optimally adjusted.

As the control criterion with the receiver element described above is a constant interference or noise signal, large quantities of data over a long period of time cannot be transmitted. The receiver element interprets a useful signal in the same way as a noise signal, and therefore during reception of the useful signal the effect of the control is to reduce its sensitivity so much that the data signal can no longer generate the output signal with certainty. As the pulse former stage generates an output signal of constant duration for each received burst of oscillations irrespective of its length, Pulse Burst Width Modulation cannot be used.

SUMMARY OF THE INVENTION

It is the principal object of the invention to propose a method of the aforementioned type and also to propose a receiver apparatus for the implementation of the method, which makes possible long data transmission and the use of Pulse Burst Width Modulation whilst keeping the described control properties (particularly control to provide a constant error/noise signal) and good noise suppression.

This and other objects are achieved through the method identified in independent claims 1 and 2.

Accordingly, after reception of a useful data signal, a discharge pulse is generated dependent on the output signal from the pulse counter circuit. When this discharge pulse appears, the charge on the capacitor which was generated before by the data signal is removed. The capacitor is discharged such that the removed charge corresponds to the charge given to the capacitor on reception of the data signal.

The advantages achieved with the invention are seen to be that the reception conditions after reception of a useful data signal are adjusted or restored to be as they were beforehand. In this way a very weak signal can be received immediately after reception of a very strong signal. The global sensitivity of the apparatus is in this way no longer influenced by the data signal but only by the noise signal, and the apparatus can now also be set up for reception of long duration datastreams and also those modulated with Pulse Burst Position Modulation and/or Pulse Burst Width Modulation. With a particular method of implementation the apparatus is ready for the reception of the next burst of oscillations immediately after the end of the last, so that the data transmission rate can be raised significantly.

The invention will be explained below in more detail using various implementations and embodiments as examples in conjunction with the drawings.

DETAILED DESCRIPTION OF PREFERRED EMBODIMENTS

Figure 1:
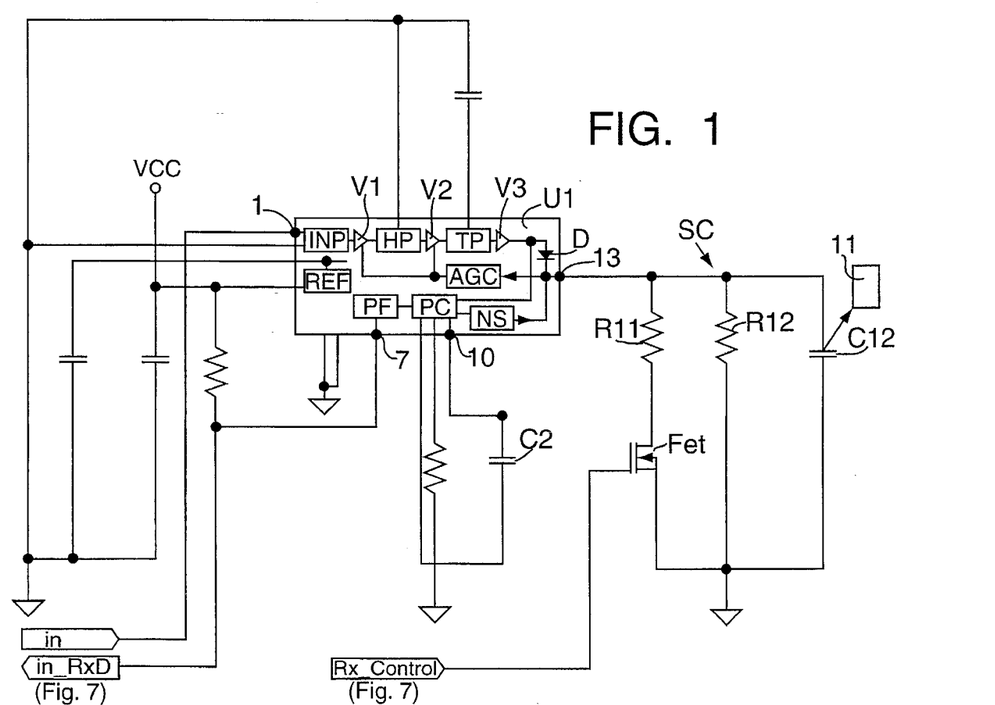
FIG. 1 is a receiver circuit diagram according to a first embodiment of the invention.

In FIG. 1 a receiver element is labelled U1, for which preferably the component U 2506 B (available on the market in monolithic integrated form from AEG Telefunken) can be used. This receiver element is particularly suitable for the reception of signals in the form of bursts of oscillations which are modulated using Pulse Burst Position Modulation (PBPM, FIG. 10), whereby the bursts of oscillations have a frequency of 455 kHz for example. The receiver element U1 basically contains an input stage INP, a high pass filter HP and a low pass filter TP, which are connected in series via amplifiers V1 and V2. The low pass filter TP is connected to a further amplifier V3, whose output is connected directly to a signal detector in the form of a pulse counter PC, and indirectly via a diode D to pin 13 of the element U1. The pulse counter circuit PC is connected to a pulse former stage PF and a noise suppression circuit NS, whose output is connected to pin 13. The automatic gain control AGC is connected on the input side with pin 13 and on the output side with the amplifiers V1 and V2. A capacitor C2, connected with the pulse counter circuit PC via pin 10, belongs functionally to this circuit but is arranged outside of the receiver element U1 (see also C2, FIG. 2). One input is labelled 1, via which the bursts of oscillations (received from a photo-diode for data transmission by infra-red light, for example) are taken to the input stage INP. An output signal from the pulse former stage PF is brought out via output 7, which represents the actual useful data signal.

The automatic gain control AGC is connected via pin 13 to a switching circuit SC, which consists of three parallel branches. Here are arranged a capacitor C12 in the first branch, a resistor R12 in the second branch and a series connection of a resistor R11 and a field-effect transistor (Fet) in the third branch. The gate of the FET is connected to a control unit (21, FIG. 7).

The unmarked connections and elements in FIG. 1 serve basically to supply current, for which purpose a voltage source (not shown) is connected via VCC. Other elements, also unmarked, are not relevant for the functional description.

Figure 2:
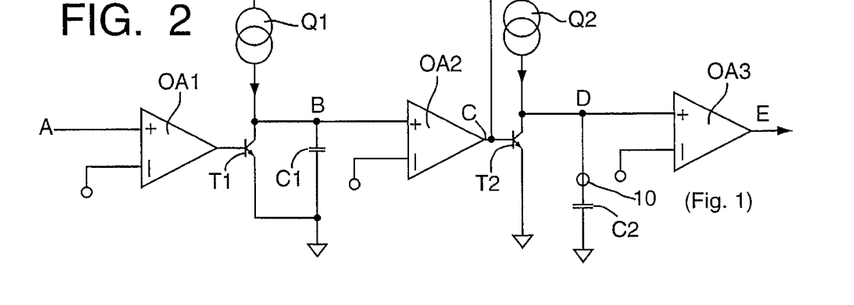
FIG. 2 is a pulse counter circuit diagram of the receiver shown in FIG. 1.

As shown in FIG. 2, the pulse counter circuit PC consists of three comparators OA1, OA2, OA3 connected one after the other, whereby the outputs of the first two comparators OA1 and OA2 are connected to the bases of transistors T1 and T2 respectively, whose collectors are connected with the input of the following comparators OA2 and OA3 respectively and with constant current sources Q1 and Q2 respectively. Capacitors C1 and C2 are provided in the output circuits of the transistors T1 and T2, whereby the capacitor C2, as mentioned, is arranged outside the pulse counter circuit PC (see also FIG. 1). The output C of the second comparator OA2 is connected to the noise suppression circuit NS and the output E of the third comparator OA3 is connected to the pulse former stage PF. The filtered and amplified bursts of oscillations from the amplifier V3 (FIG. 1) are taken to the input A of the first comparator OA1, while constant threshold or reference voltages are applied to the other inputs of all three comparators OA1, OA2 and OA3.

Figure 3A:
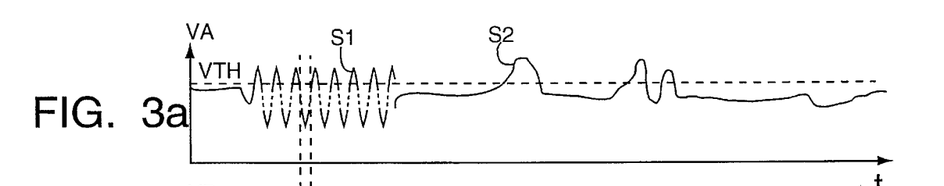
FIGS. 3a, 3b, 3c, 3d and 3e represent timing diagrams for the interaction of various input and output signals of the pulse counter circuit according to FIG. 2.

In diagram 3a a data signal is labelled S1 and a noise signal is labelled S2, whereby the data signal S1 is received in the form of constant duration bursts of oscillations when Pulse Burst Position Modulation is used. Data and noise signals S1 and S2 appear as a voltage VA at the input A of the first comparator OA1, and are compared with a threshold voltage VTH of typically 20 mV.

Figure 3B:
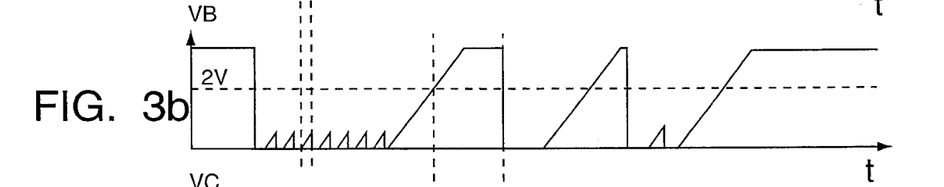
Figure 3C:
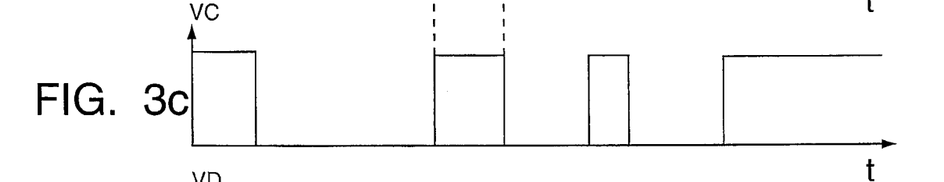

FIGS. 3b and 3c show the voltage waveforms VB and VC at the input and output respectively of the second comparator OA2 (point B and output C), whereby the reference voltage is typically 2 V.

Figure 3D:
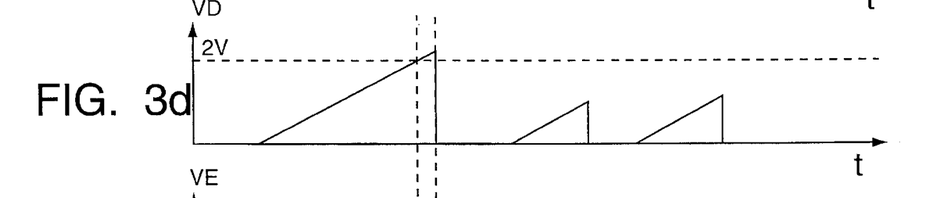

FIG. 3d shows the voltage waveform VD at one input to the third comparator OA3 (point D).

Figure 3E:
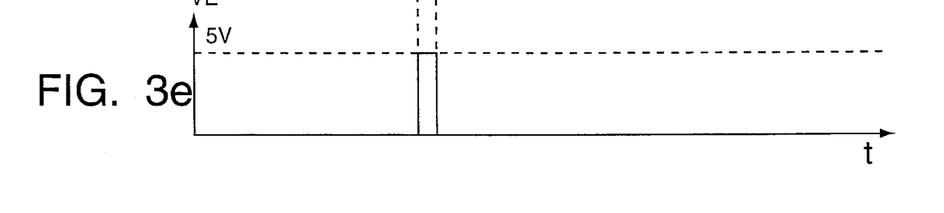

An output signal in the form of a trigger pulse with a voltage VE of 5 V appearing at the output E of the third comparator OA3 is illustrated in FIG. 3e, for a reference voltage of 2 V in FIG. 3d.

The known part of the apparatus described above operates in the following way:

The burst of oscillations (brought to the input stage INP) is amplified in the amplifier V1, and is then taken through the high pass filter HP (fifth order Butterworth filter with a corner frequency of 320 kHz). In this way strong suppression of low frequency noise signals is achieved. After further amplification in amplifier V2 the data signal S1 passes through the low pass filter TP (third order Butterworth filter with a corner frequency of 500 kHz) for the purpose of further improving the transmission properties. The signal is then amplified again in the amplifier V3, achieving a maximum gain of 90 dB. The data signal S1, so amplified, is taken to the input A of the pulse counter circuit PC, where the first comparator OA1 produces a control signal when a threshold level VTH of 20 mV is exceeded, with which the transistor T1 is controlled (FIGS. 2, 3a). Here the first capacitor C1, which is charged by the first constant current source Q1, is discharged whenever the data or noise signals S1, S2 exceed the threshold voltage VTH, resulting in the voltage waveform VB, as shown in FIG. 3b, at point B (FIG. 2). When compared with the reference voltage of 2 V, this results in the waveform VC, as shown in FIG. 3c, at the output C of the second comparator OA2, by means of which the transistor T2 is controlled. In this way the capacitor C2 (which is charged by the constant current source Q2) is discharged whenever the voltage at point B exceeds the reference voltage of 2 V (FIG. 2). When the reference voltage is no longer exceeded, the capacitor C2 is charged again, leading to the voltage waveform VD at point D, as shown in FIG. 3d. The conditions are now chosen such that the steadily rising voltage VD reaches the reference voltage of 2 V at the third comparator OA3 after a time of approx. 18 μs, which corresponds to eight oscillations of a burst with a frequency of 455 kHz. When the reference voltage is exceeded the first output signal appears at the output E of the third comparator OA3 in the form of a trigger pulse (FIG. 3e), by means of which the following pulse former stage PF (FIG. 1) generates an output signal of a fixed, constant duration, which represents the actual useful data signal.

A reduction in sensitivity (or receiver gain) is achieved in the noise suppression circuit NS for the purpose of attaining a large noise margin: for the duration of each negative pulse at point C (FIGS. 2, 3c), capacitor C12 (part of the switching circuit SC, FIG. 1) is charged with a constant current of approx. 10 mA by charging means 11, shown in FIG. 1. If few pulses are now received, the mean value of this charging current is lower than an internal discharge current, which represents the decay time of the automatic gain control AGC. If the capacitor C12 is charged to a particular value and the apparatus has not received a signal for a short time, the sensitivity rises. With increasing sensitivity, however, more noise signals at input A (FIG. 2) exceed the threshold voltage VTH at the comparator OA1. These signals thereby charge capacitor C12 more often, which reduces the sensitivity again. In this way the noise level at point A is kept at a virtually constant level, due to a dynamic balance between charging and discharging of the capacitor C12, and the sensitivity is optimally adjusted.

The circuit interprets the data signal, however, in exactly the same way as a noise signal, and during reception of long, continuous data signals (similarly during reception of a long train of pulses) it reduces its sensitivity so much that the data signal can no longer produce the output signal (trigger pulse as shown in FIG. 3e) with certainty. If long datastreams must be transmitted, a different control criterion must be used, as described in more detail below.

Figure 4:
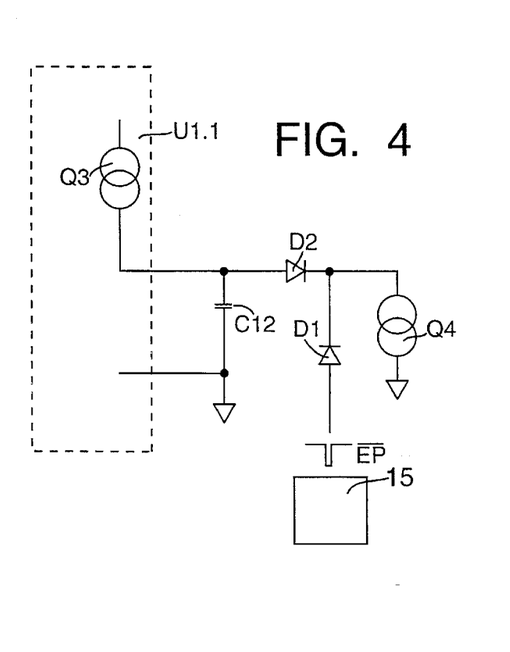
FIG. 4 is a circuit diagram of a part of the receiver circuit of FIG. 1 in a second embodiment.

In FIG. 4, a replacement circuit for part of the receiver element U1 (FIG. 1) is labelled U1.1. A current source Q3 within the replacement circuit is connected to a capacitor C12, which corresponds to the capacitor C12 in FIG. 1. The cathode of a diode (labelled D1) is connected on the one hand to a further current source Q4 and on the other hand to the cathode of another diode D2, whose anode is connected to capacitor C12. A discharge pulse (labelled $\overline{EP}$) is generated by a monostable flip-flop stage 15, in FIG. 4 with voltage source characteristics and is applied to the anode of diode D1.

The circuit arrangement described above operates as follows, as shown in FIG. 4.

In the rest state, a first voltage at capacitor C12 is smaller than a second voltage applied via diode D1, so that the second diode D2 is blocked and the additional current source Q4 is supplied via diode D1 by its voltage source. At the end of the constant duration output signal from the pulse former stage PF, its trailing edge is used as the trigger signal for the monostable flip-flop mentioned above, which thereupon generates the discharge pulse $\overline{EP}$. On appearance of the discharge pulse $\overline{EP}$, the second voltage is decreased to a value which is smaller than the first voltage so that diode D2 conducts and diode D1 is blocked, whereby the capacitor C12 discharges and the discharge current flows through the further current source Q4. In this way the charge removed from the capacitor C12 is proportional to the product of the discharge current and the duration of the discharge pulse, and corresponds to the charge previously given to the capacitor C12 by the data signal. In this way the charge given by the data signal and taken away by the discharge pulse to/from capacitor C12 averages to zero over time, so that the control properties of the receiver element remain as before and yet long data (long pulse trains) can be transmitted. Instead of the diode combination D1, D2 in FIG. 4, a switching transistor could of course also be used.

The circuit arrangement described above (as per FIG. 4) can also be realised generally speaking by the part circuit SC (FIG. 1). The discharge pulse—labelled "Rx_Control" here—is generated by a control unit 21 (FIG. 7) and applied to the field effect transistor Fet. When the discharge pulse appears at the field effect transistor Fet, it conducts and the total resistance in the third branch reduces, so that a charge corresponding to the data signal can flow away via the series combination of R11 and the FET.

When Pulse Burst Position Modulation is used, in which bursts of oscillations of at least two different durations are employed, the different charges caused by the different signal lengths must be correctly compensated. As the pulse former stage PF can no longer be used here, another circuit arrangement (described below with the aid of FIGS. 5 and 6) must be used.

Figure 5:
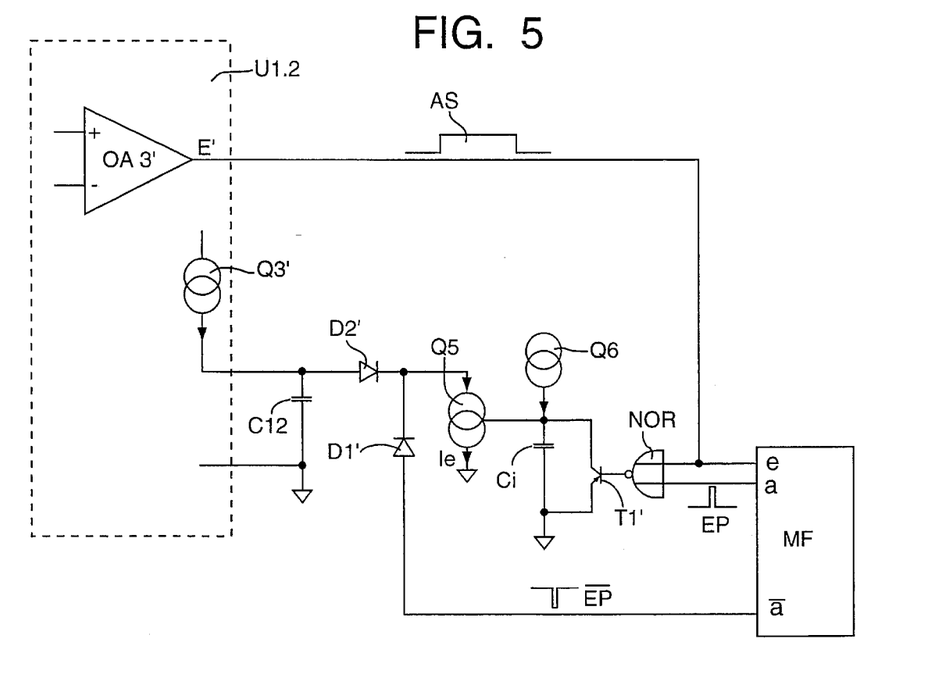
FIG. 5 is a circuit diagram of a part of the receiver circuit of FIG. 1 in a third variant.

As shown in FIG. 5 part U1.2 of a replacement circuit for the receiver element U1 (FIG. 1) consists of a comparator OA3' and a current source Q3'. The comparator OA3' is placed outside the receiver element and connected at one input to capacitor C2 (FIG. 1) which is identical to capacitor C2 in FIG. 2. The current source Q3' is connected to the capacitor C12, which corresponds to capacitor C12 in FIG. 1. A diode, labelled D1', has its anode connected to an output "$\overline{a}$" of a monostable flipflop MF. The cathode of diode D1' is connected on one hand to a voltage controlled current source Q5 and on the other hand to the cathode of a further diode D2', whose anode is connected to capacitor C12. An integration capacitor Ci is arranged in the output circuit of a transistor T1', and together with the collector of transistor T1' it is connected to a constant current source Q6 and the voltage controlled current source Q5. The base of transistor T1' is connected to the output of a two-input NOR-gate "NOR", one of whose inputs is connected to output E' of comparator OA3' and input "e" of the monostable flip-flop MF. The other input of the NOR-gate is connected to output "a" of the monostable flip-flop MF. A positive pulse at the output "a" is labelled EP and a negative discharge pulse at output "$\overline{a}$" is labelled $\overline{EP}$. An output signal appearing at the output E' of comparator OA3' is labelled AS and represents the (now pulse width modulated) data signal.

Figure 6A:
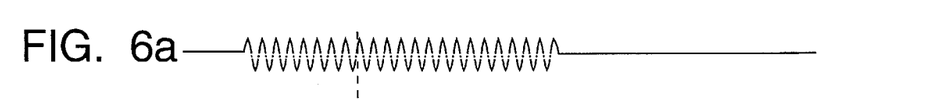
FIGS. 6a, 6b, 6c and 6d are timing diagrams for the interaction of input and output signals in the third variant shown in FIG. 5.
Figure 6B:
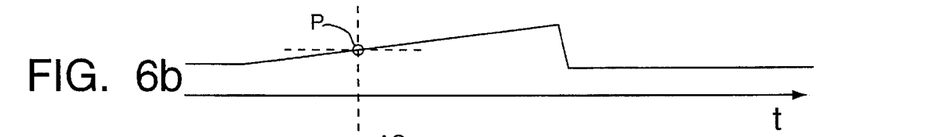
Figure 6C:
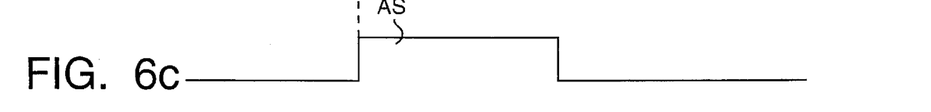
Figure 6D:
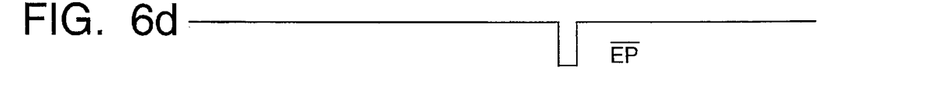
Figure 10:
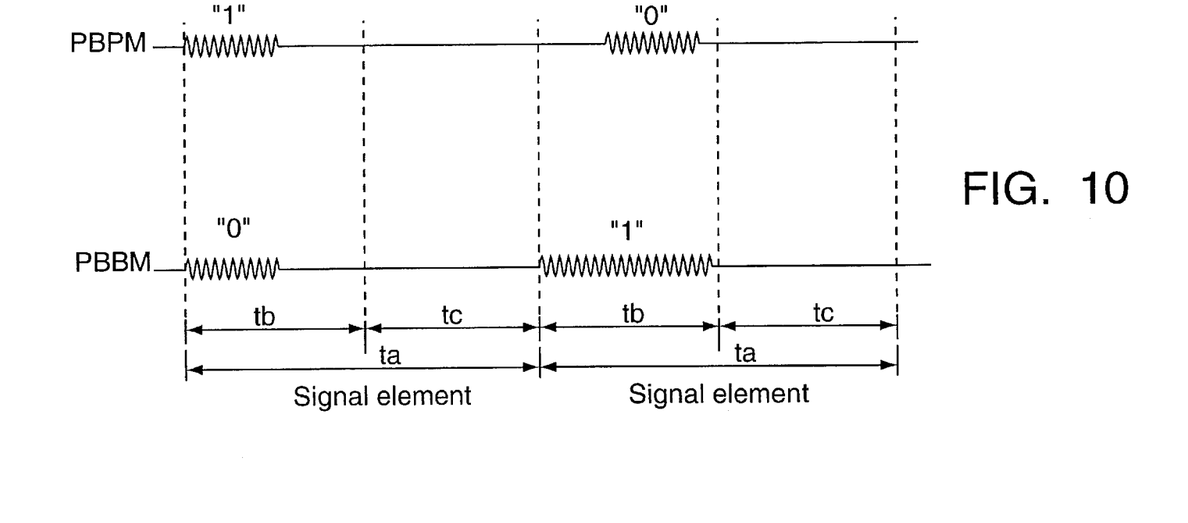
FIG. 10 is an impulse diagram of the pulses to be transmitted in the form of bursts of oscillations.

In FIG. 6 the following meanings are assigned to parts a to d:

a the received useful data signal in the form of a burst of oscillations modulated by Pulse Burst Width Modulation (FIG. 10 );

b the voltage waveform at capacitor C2 in the pulse counter circuit PC (FIG. 2, point D);

c the output signal AS at output E' of comparator OA3' ( FIG. 5 );

d the discharge pulse "$\overline{EP}$" at output "$\overline{a}$" of the monostable flip-flop MF (FIG. 5).

The circuit arrangement described above, as shown in FIG. 5, operates in the following way:

After the first eight oscillations of the received burst, the comparator OA3' switches (point P, FIG. 6b), and the output signal AS appears at its output E' (FIG. 6c). On appearance of the output signal AS the transistor T1' is blocked, so that the integration capacitor Ci is charged linearly by the constant current source Q6. The voltage across the integration capacitor Ci is a measure of the pulse duration and is applied to the voltage controlled current source Q5 A corresponding current Ie thereby flows from the current source Q5 through diode D1', and a voltage is present at the cathode of diode D2' which is higher than the voltage across capacitor C12 so that diode D2' is reverse biased. At the appearance of the trailing edge of the first output signal AS at the end of the burst of oscillations the monostable flip-flop MF switches, and the positive pulse EP (at output "a") and the negative discharge pulse $\overline{EP}$ (at output "$\overline{a}$") appear (see FIG. 6d).

Neglecting the delay time of the monostable flip-flop MF, the transistor T1' remains blocked, as before, and the constant current source Q6 continues to charge the integration capacitor Ci. With the appearance of the positive pulse EP the current through the voltage controlled current source Q5 is changed by an amount $\Delta$Ie. With the discharge pulse EP the anode voltage of diode D1' falls, causing it to reverse bias, diode D2' to conduct and the discharge of capacitor C12 to commence.

During the discharge of capacitor C12 the following partial charges are removed:

a) charge transferred to the capacitor during the first eight oscillations of the data signal. This corresponds to the received data signal, until the output signal AS indicates the presence of the data signal, reduced by the product of $\Delta$Ie and the duration of the discharge pulse $\overline{EP}$ (constant charge);

b) charge transferred by the data signal to the capacitor while the output signal AS indicates the presence of the data signal (variable part of the total charge, caused by the varying signal lengths employed with pulse width modulation).

As the receiver circuit described above is ready for the reception of very weak signals even after receiving signals with a very high input signal strength, it can be used to advantage in a bidirectional data transmission method, in other words between communicators that have both a tranmitter and a receiver; such a method will be described briefly with the aid of FIGS. 7, 8 and 9. With this method a bit will be broadcast by the receiver's "own" transmitter (results in a very high input signal strength at the receiver in question), with a bit then being received immediately afterwards from the transmitter of another, distant communicator (weak signal).

Figure 7:
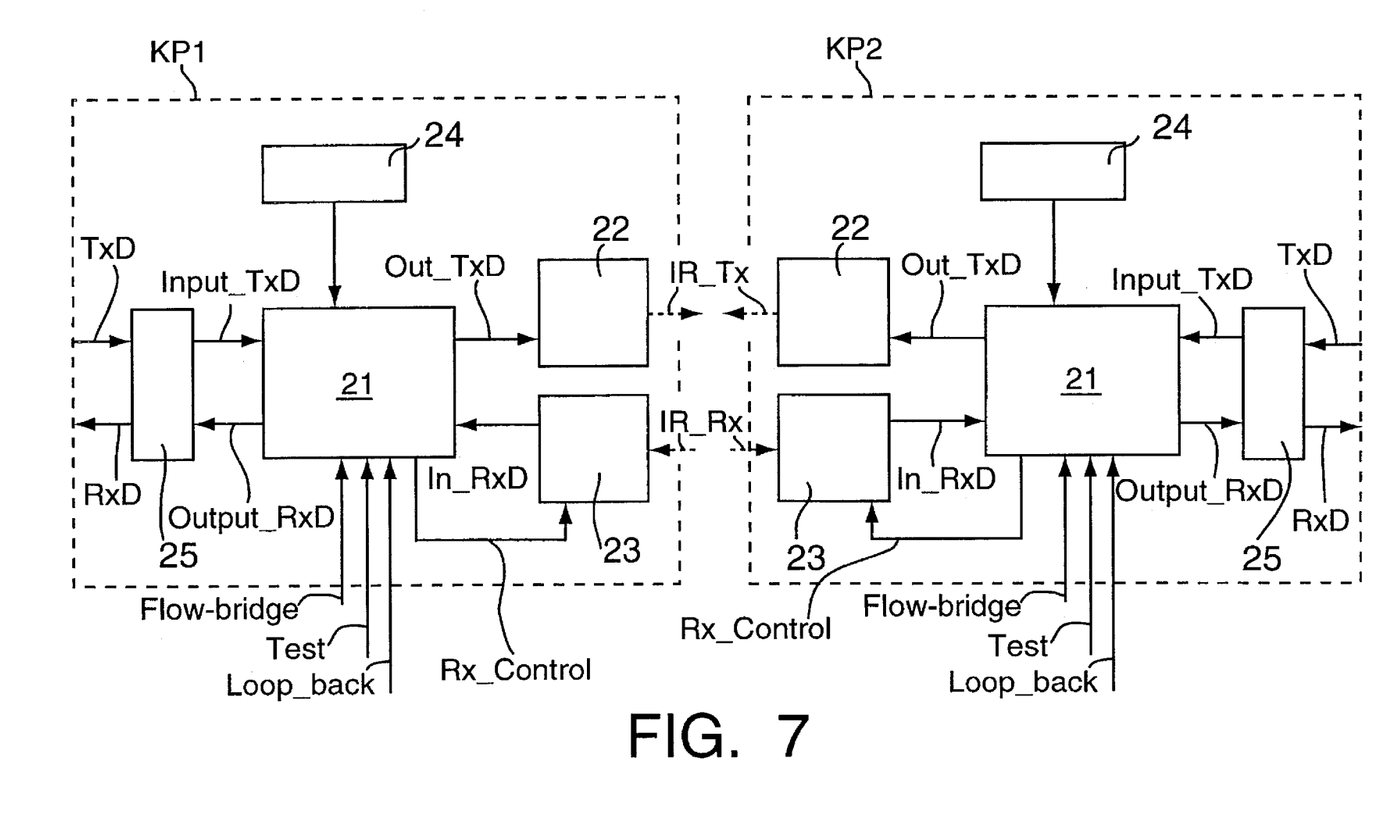
FIG. 7 shows a block diagram of two communicators, each being equiped with a receiver circuit according to the invention.

In FIG. 7 two communicators, for example computers or other intelligent electronic systems, are labelled KP1 and KP2. Each communicator KP1, KP2 has a control unit 21, a tranmitter 22 and a receiver 23, the control unit 21 being connected to the transmitter 22 by a signal Out_TxD and to the receiver 23 by signals In_RxD and Rx_Control. An oscillator 24, which generates a clock signal with a typical frequency of 5.0688 MHz, is connected to the control unit 21. The control unit 21 has connections to a voltage level shifter 25 via signals Input_TxD and Output_RxD. The data to be transmitted is brought to the voltage level shifter 25 via signal TxD, and the data received is output on the signal RxD. The data transmitted and received (for example via fibre optics, light waves as e.g. infra red, or radio) is indicated with dashed arrows IR-Tx and IR-Rx respectively. Three inputs to the control unit are labelled Flow_bridge, Test and Loop_back, with which corresponding operating modes can be activated.

Figure 8:
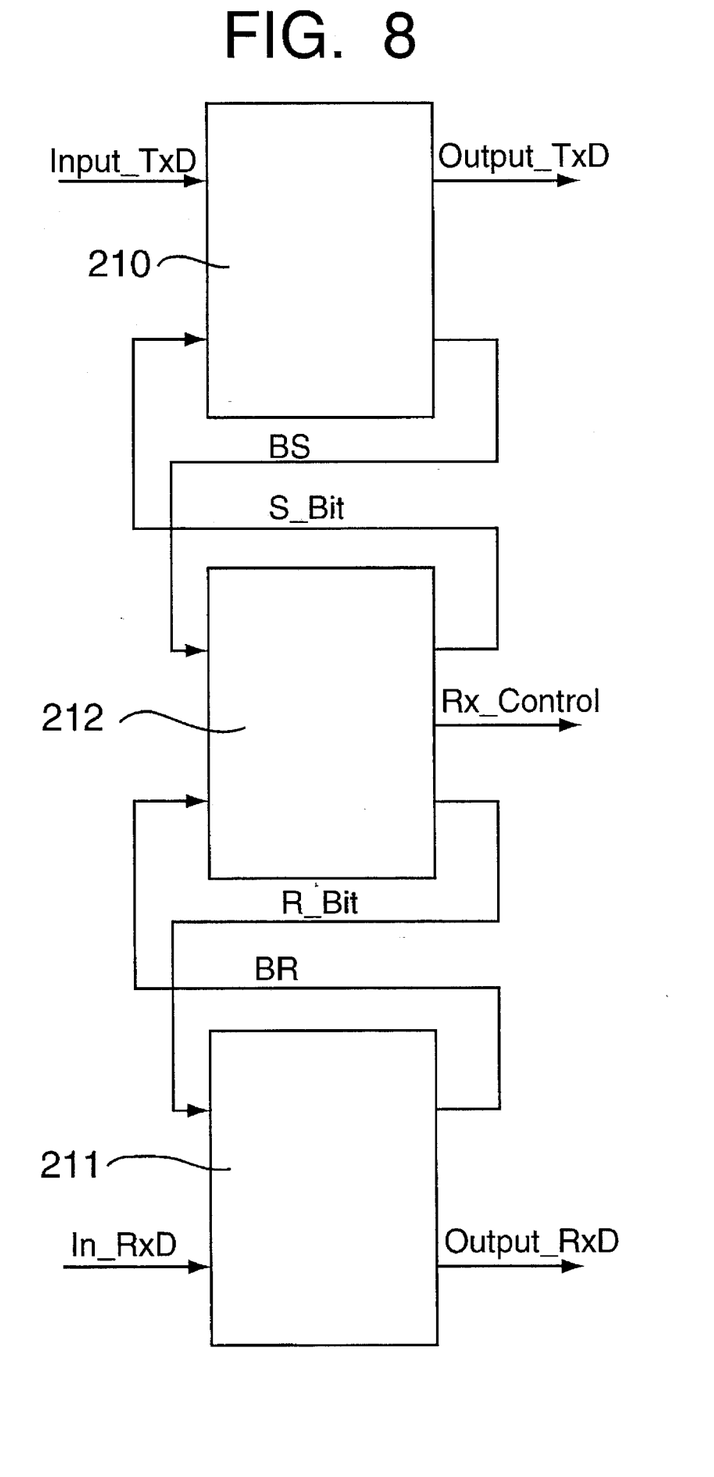
FIG. 8 is a block diagram of a control unit for a communicator as shown in FIG. 7.

As shown in FIG. 8 the control unit 21 consists of a transmit part 210, a receive part 211 and a state machine 212. The parts 210, 211 and the state machine 212 are connected to each other by signals BS, S_Bit and BR, R_Bit, with which handshaking signals are exchanged. The transmit part 210 and the receive part 211 fulfill transmission and reception related tasks respectively, and the state machine 212 co-ordinates both parts 210, 211 and also generates the signal Rx_control which is necessary for the control of the receiver 23 (see also FIG. 1).

Figure 9:
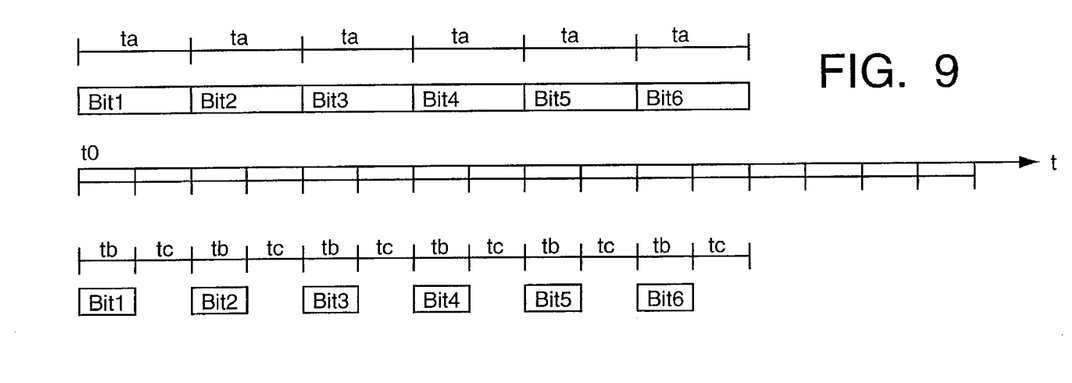
FIG. 9 shows diagrams which represent the distribution of bits and unused time periods for a datastream to be transmitted.

It can be seen from FIG. 9 that the time separation ta between the commencement of successive bits of a datastream is divided into two equal halves tb and tc. The bits are shortened and are only transmitted during the first half tb, while the second half tc represents unused time for the datastream under consideration. In this way it is possible for two communicators to exchange data simultaneously, i.e. bidirectionally, as the transmitted bits of one datastream are transmitted in the second half tc of the datastream in the opposite direction. In the following description the term "signal element" is also used to indicate the time period ta.

The following abbreviations are used in FIG. 10:

PBPM pulses (bits) of constant duration in the form of bursts of oscillations, modulated using Pulse Burst Position Modulation. For this method a burst which represents logic "1" begins immediately at the start of the time period ta, and a burst which represents logic "0" begins a defined delay time after the start of the time period ta.

PBBM pulses (bits) of varying durations in the form of bursts of oscillations, modulated using Pulse Burst Width Modulation. For this method a long duration burst represents logic "1" and a short duration burst represents logic "0".

In communication networks with multiple participants, in which for example a CSMA/CA (carrier sense, multiple access/collision avoidance) protocol is used for an orderly exchange of data, a combination of PBPM and PBBM modulation methods can be used. Here a communicator which has a transmit requirement and which has not received a bit identifies itself as an initializing communicator IKP, and one which has no transmit requirement but which has received a bit identifies itself as a receiving communicator EKP. To begin data transmission the initiating communicator IKP sends a double length start bit expressing its identity (PBBM, logic "1", FIG. 10). It then waits a certain time, during which the receiving communicator EKP sends back an echo (Loop_back operation) in the form of a single length start bit (PBPM, logic "1", FIG. 10). The initiating communicator IKP waits after each transmitted bit for the echo and compares it on arrival with the transmitted bit (Test), and terminates transmission when an inequality occurs.

Another receiving communicator EKP, that receives the returned single length start bit, does not itself send an echo. Whether the start bit is single or double length can be checked during the half signal element tb (at the receiving communicator EKP) depending on the charge on capacitor C2 (FIGS. 1, 2 and 6b).

It is apparent that with the apparatus described above, the same results are obtained if the duals of the components used are substituted (e.g. inductance for capacitance, voltage source for current source). It is also apparent that this method can be used for all receivers whose control criterion is to achieve a constant noise signal. Finally it should be emphasised that it is not necessary to use a pulse counter circuit (which is part of the known receiver element that was taken as an example) as the signal detector, but other signal detectors known per se can be used for this purpose.

Another variant of the method is possible, with which the charge to be removed from capacitor C12 by the discharge pulse $\overline{EP}$ is determined by a digital circuit on the basis of the signal length and recognition of the signal as a data signal.

In order to achieve a situation (as described with the aid of FIG. 4) where the charge transferred to capacitor C12 by the data signal and then removed from the capacitor averages to zero over time, the method described below with the aid of FIGS. 11 and 12 can be used, provided that it is known at which time a burst of oscillations will appear.

Figures 11, 12A, 12B:
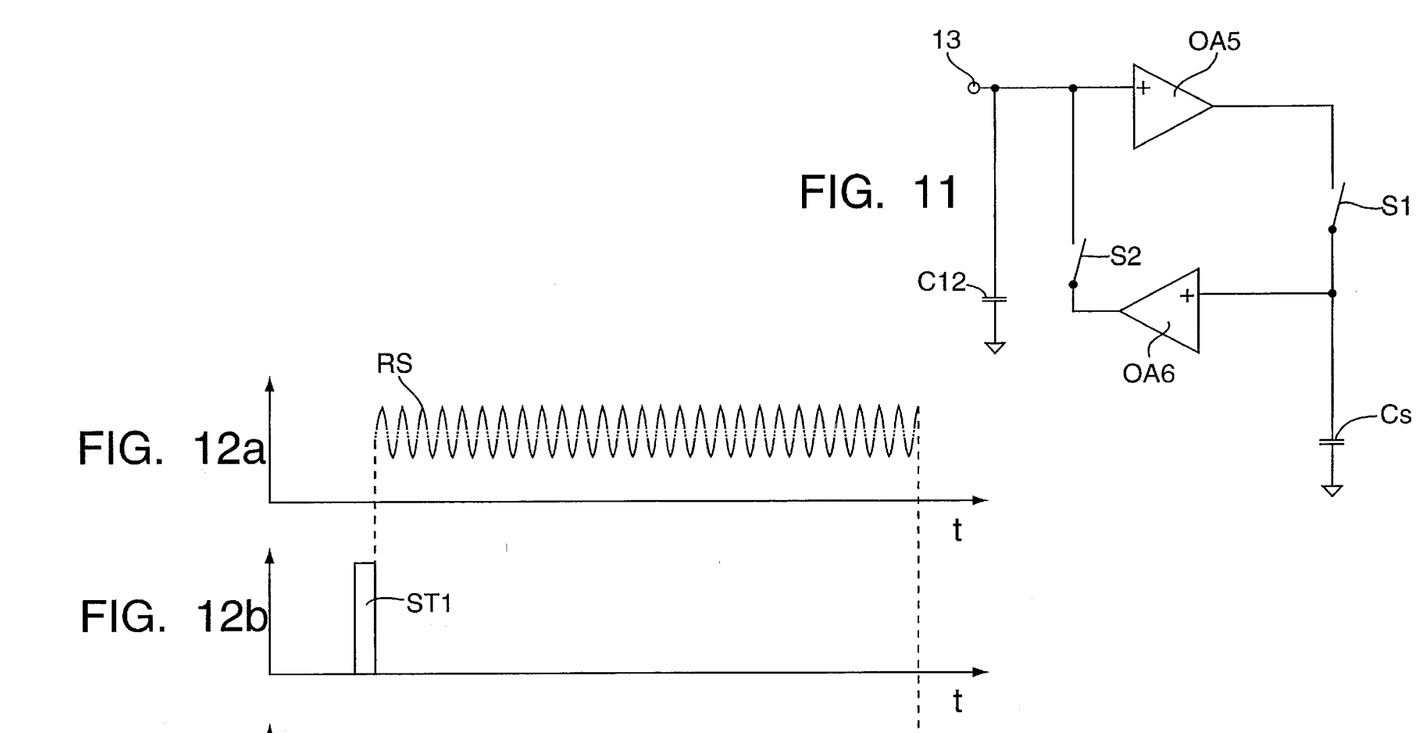
FIG. 11 is a circuit diagram of a part of the apparatus according to FIG. 1 in a further embodiment.
FIGS. 12a, 12b and 12c are timing diagrams for the interaction of signals for the embodiment shown in FIG. 11

In FIG. 11 two operational amplifiers are labelled OA5 and OA6. The output of the first operational amplifier OA5 is connected to one input of the second operational amplifier OA6 by a switch S1. The output of the second operational amplifier OA6 is connected to one input of the first operational amplifier OA5 by a second switch S2. This input is further connected to pin 13 and a capacitor C12, which correspond to pin 13 and capacitor C12 in FIG. 1. The input of the second operational amplifier OA6 is connected to a further capacitor Cs.

Figure 12C:
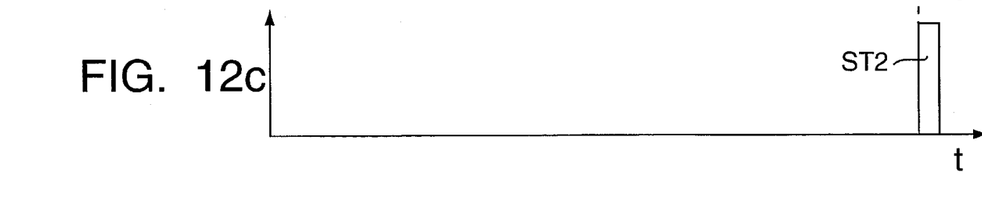

The following symbols are used in FIG. 12:
a shows the received data signal RS in the form of a burst of oscillations,
b shows a control pulse ST1 for the first switch S1, and
c shows a control pulse ST2 for the second switch S2.

The apparatus described above in conjunction with FIGS. 11 and 12 operates as follows:

Before the appearance of the data signal RS (at a predetermined time) the control pulse ST1 is generated, so that the first switch S1 is closed and the voltage on capacitor C12 is transmitted to the capacitor Cs by the first operational amplifier OA5. After the opening of switch S1 the voltage so transmitted is held on capacitor Cs. At the end of the data signal RS the control pulse ST2 is generated, so that the second switch S2 is closed and the voltage on capacitor Cs is transferred back to capacitor C12 by the second operational amplifier OA6. In this way the voltage on capacitor C12 is forced back to the level it was at before the appearance of the data signal RS. A condition for this is that the total gain of the two operational amplifiers equals 1.

I claim:

1. A method for gain control of a noise signal in received digital input signals, including noise and data signals in the form of pulses consisting of bursts of oscillations, said method comprising the steps of:

filtering the received digital input signals;

amplifying the filtered input signals, presenting said filtered and amplified signals to a signal detector (PC);

generating from said signal detector (PC) an output signal after reception of said input signals, corresponding to said filtered and amplified signals;

presenting said output signal to a noise suppression circuit (NS);

charging a capacitor (C12), for the purposes of automatic signal gain control during the occurrence of noise and data signals, in such a way that, when few of said input signals exceed a threshold level, a correspondingly small charge is generated in said capacitor, and the gain sensitivity is raised, and when many digital input signals exceed a threshold level, a correspondingly large charge is generated in said capacitor, and the gain sensitivity is reduced, generating a discharge pulse (EP), and thereafter causing the charge transferred to the capacitor (C12) by the data signal to be removed again.

2. The method according to claim 1, further comprising the steps of:

receiving constant duration bursts of oscillations, generating an output signal at the signal detector (PC) at the end of a burst of oscillations, using the output signal as a trigger pulse having a trailing edge;

presenting the trigger pulse to a pulse former stage (PF);

outputting a constant duration output signal and using the trailing edge of said constant duration output signal as a trigger signal for the generation of said discharge pulse (EP).

3. The method according to claim 1, further comprising the steps of:

receiving constant duration bursts of oscillations generating an output signal from the signal detector, which is in the form of a pulse counter circuit (PC), the output signal appears only after receipt of a constant number of oscillations, the output signal having a trailing edge which acts as a trigger pulse;

presenting the trigger pulse to a pulse former stage (PF), which thereupon generates a constant duration output signal, the trailing edge of the constant duration output signal generated by the pulse former stage (PF) is used as a trigger signal for the generation of said discharge pulse (EP).

4. The method according to claim 2 further comprising the step of:

applying the voltage at the capacitor (C12) to the anode of a diode (D2), such that in a rest state a larger voltage is present at the cathode of the diode (D2), and the capacitor (C12) cannot be discharged; and when the discharge pulse (EP) appears, the voltage at the cathode of said diode (D2) is lowered to a value smaller than the voltage on the capacitor (C12), so that the capacitor is discharged.

5. The method according to claim 1, further comprising the steps of:

receiving bursts of oscillations of varying duration, the duration of the output signal generated by the signal detector (PC) being proportional to the duration of the burst of oscillations received at that time; and using the trailing edge of the output signal (AS) as a trigger signal for the generation of said discharge pulse (EP).

6. The method according to claim 5, further comprising the steps of:

integrating the output signal generated by the signal detector (PC) is over time, whereby the integral is a measure of the magnitude of the current with which the capacitor (C12) is discharged for a fixed time upon appearance of said discharge pulse (EP).

7. The method according to claim 6, further comprising the steps of:

integrating the output signal (AS) generated by the signal detector (PC), by means of an integration capacitor (Ci) being charged for the duration of the output signal (AS) from a constant current source (Q6);

applying the voltage across the integration capacitor (Ci) to a voltage controlled current source (Q5), which generates a current flowing through a diode (D1'), whereby a voltage is applied to the cathode of a second diode (D2') which is larger than the capacitor (C12) voltage applied to the anode of said second diode (D2'), so that said capacitor (C12) cannot be discharged; and changing the current generated by said voltage controlled current source (Q5) upon appearance of the discharge pulse (EP) by a given amount thereby discharging the capacitor (C12).

8. The method according to claim 1, further comprising the step of:

using a digital switch circuit to determine the charge removed from the capacitor (C12) by said discharge pulse (EP), the determination being made on the basis of the input signal duration and the recognition of the signal as a data signal.

9. The method according to claim 3, further comprising the steps whereby the voltage at the capacitor (C12) is applied to the anode of a diode (D2);

in a rest state a larger voltage is present at the cathode of the diode (D2), so that the capacitor (C12) cannot be discharged; and when the discharge pulse (EP) appears, the voltage at the cathode of said diode (D2) is lowered to a value smaller than the voltage on the capacitor (C12), so that the capacitor is discharged.

10. A method for receiving input signals, including noise and data signals, in the form of pulses consisting of bursts of oscillations, said method comprising the steps of:

filtering the received input signals, amplifying the filtered input signals, generating an output signal after reception of said input signal, corresponding to said filtered and amplified signals, from said signal detector (PC);

presenting said output signal to a noise suppression circuit (NS);

charging a capacitor (C12), for the purposes of automatic signal gain control during the occurrence of noise and data signals, in such a way that, when few of said input signals exceed a threshold level, a correspondingly small charge is generated in said capacitor, and the gain sensitivity is raised, and when many digital input signals exceed a threshold level, a correspondingly large charge is generated in said capacitor, and the gain sensitivity is reduced, measuring, before the appearance of a burst of oscillations (RS) representing a data signal, the voltage across the capacitor (C12) and, at the end of said burst of oscillations, restoring the voltage across the capacitor (C12) to the satire value as it was before the appearance of said burst of oscillations (RS).

11. Apparatus for controlling noise signal gain in received digital input signals, including noise and data signals, the apparatus, comprising filter stage circuitry for filtering the input signals, input amplifier for amplifying the filtered input signals, a signal detector (PC) for receiving said filtered and amplified signals and generating an output signal therefrom;

a noise suppression circuit (NS) for receiving the signal detector (PC) output signal;

a means for charging, for the purposes of automatic signal gain control during the occurrence of noise and data signals, a capacitor (C12) in such a way that, with few of said input signals exceeding a threshold level and a correspondingly small charge, the gain sensitivity is raised, and with many digital input signals exceeding a threshold level and a correspondingly large charge the gain sensitivity is reduced again, depending on said output signal from said signal detector (PC), a means for generating a discharge pulse (EP) and thereafter causing the charge transferred to the capacitor (C12) by the data signal to be removed again;

wherein the input amplifier and filter stage circuitry is connected to an automatic gain control (AGC) and said signal detector (PC), whereby the signal detector (PC) is connected to both a pulse former stage (PF) and a noise suppression circuit (NS), and whereby the input to the automatic gain control (AGC) and the output of the noise suppression circuit (NS) are connected to said capacitor (C12), a first diode (D1), whose anode is connected to a voltage source and whose cathode is connected on one hand to a current source (Q4) and on the other hand with the cathode of a second diode (D2), whose anode is connected to said capacitor (C12);

and wherein the voltage at the capacitor (C12) is applied to the anode of a diode (D2), in a rest state a larger voltage is present at the cathode of the diode (D2), so that the capacitor (C12) cannot be discharged; and when the discharge pulse (EP) appears, the voltage at the cathode of said diode (D2) is lowered to a value smaller than the voltage on the capacitor (C12), so that the capacitor is discharged.

12. Apparatus for controlling noise signal gain in received digital input signals, including noise and data signals in the form of bursts of oscillations of varying duration, the apparatus comprising:

input amplifier for amplifying the input signals, filter stage circuitry for filtering the input signals, said filter stage circuitry is connected to an automatic gain control (AGC) and a signal detector (PC) means for receiving said filtered and amplified signals and generating a signal detector output signal from the signal detector (PC) whose duration is proportional to the duration of the burst of oscillations, and in that a trailing edge of the output signal (AS) is used as a trigger signal for the generation of a discharge pulse (EP) and wherein the signal detector (PC) output signal is integrated over time, by means of an integration capacitor (Ci) being charged for the duration of the output signal (AS) from a constant current source (Q6) whereby the integral is a measure of the magnitude of the current with which a capacitor (C12) is discharged for a fixed time upon appearance of said discharge pulse (EP);

a noise suppression circuit (NS) for receiving signals from said signal detector means and whereby the input of the automatic gain control (AGC) and the output of the noise suppression circuit (NS) are connected to said capacitor (C12), also including a first diode (D1) whose cathode is connected on one hand to a voltage controlled current source (Q5) and on the other hand to the cathode of a second diode (D2'), whose anode is connected to said capacitor (C12); the diode (D1') is connected by its anode to an output (a) of a monostable flip-flop (MF);

a transistor (T1'), in whose output circuit an integration capacitor (Ci) is arranged, which is connected to a constant current source (Q6) and to the voltage controlled current source (Q5) via its connection to a collector of said transistor (T1'); a base of said transistor (T1') is connected to the output of a two-input NOR-gate (NOR), whose first input is connected to the output (E') of a comparator (OA3') and one input (e) of said monostable flip-flop (MF); and the second input to the NOR-gate (NOR) is connected to a further output (a) of said monostable flip-flop (MF).

13. Apparatus for controlling noise signal gain in received digital input signals, including noise and data signals, the apparatus comprising filter stage circuitry for filtering the input signals, input amplifier for amplifying the filtered input signals, a signal detector (PC) for receiving said filtered and amplified signals and generating an output signal therefrom;

a noise suppression circuit (NS) for receiving the signal detector (PC) output signal;

a means for charging, for the purposes of automatic signal gain control during the occurrence of noise and data signals, a capacitor (C12) in such a way that, with few of said input signals exceeding a threshold level and a correspondingly small charge, the gain sensitivity is raised, and with many digital input signals exceeding a threshold level and a correspondingly large charge the gain sensitivity is reduced again, depending on said output signal from said signal detector (PC), a means for generating a discharge pulse (EP) and thereafter causing the charge transferred to the capacitor (C12) by the data signal to be removed again;

the input amplifier and filter stage circuitry are connected to an automatic gain control (AGC) and a signal detector (PC), whereby the signal detector (PC) is connected to both a pulse former stage (PF) and a noise suppression circuit (NS), and whereby the input to the automatic gain control (AGC) and the output of the noise suppression circuit (NS) are connected to said capacitor (C12), and a series circuit consisting of a resistor (R11) and a field effect transistor (Fet) which is connected in parallel to said capacitor (C12), whereby a discharge pulse (EP) is applied to a gate of said field effect transistor (Fet).

14. Apparatus for controlling noise signal gain in received input signals, including data signals, the apparatus comprising filter stage circuitry for filtering the input signals, input amplifier for amplifying the input signals, a signal detector (PC) for receiving said filtered and amplified signals and generating an output signal therefrom;

a noise suppression circuit (NS) for receiving the signal detector (PC) output signal;

a means for charging, for the purposes of automatic signal gain control during the occurrence of noise and data signals, a capacitor (C12) in such a way that, with few of said input signals exceeding a threshold level and a correspondingly small charge, the gain sensitivity is raised, and with many digital input signals exceeding a threshold level and a correspondingly large charge the gain sensitivity is reduced again, depending on said output signal from said signal detector (PC), a means for generating a discharge pulse (EP) and thereafter causing the charge transferred to the capacitor (C12) by the data signal to be removed again;

wherein the input amplifier and filter stage circuitry is connected to an automatic gain control (AGC) and a signal detector (PC), whereby the signal detector (PC) is connected to a noise suppression circuit (NS), and whereby the input of the automatic gain control (AGC) and the output of the noise suppression circuit (NS) are connected to said capacitor (C12), first and second operational amplifiers (OA5, OA6) where the output of the first operational amplifier (OA5) is connected to the input of the second operational amplifier (OA6) via a first switch (S1); the output of the second operational amplifier (OA6) is connected to the input of the first operational amplifier (OA5) via a second switch (S2), this input being connected to said capacitor (C12) and a connection (13); and a further capacitor (Cs) connected to the input of the second operational amplifier (OA6).

15. Apparatus for controlling noise signal gain in received digital input signals, including noise and data signals in the form of bursts of oscillations of varying duration, the apparatus comprising filter stage circuitry for filtering the input signals, input amplifier for amplifying the filtered input signals, a signal detector (PC) including, a pulse counter circuit (PC), for receiving said filtered and amplified signals and generating an output signal therefrom which appears only after receipt of a constant number of said oscillations and which is a trigger pulse having a trailing edge;

a pulse former stage (PF), which generates a constant duration output signal upon receipt of said trigger pulse, the trailing edge of the constant duration output signal being a trigger signal for the generation of a discharge pulse (EP);

a noise suppression circuit (NS) for receiving the signal detector (PC) output signal;

a means for charging, for the purposes of automatic signal gain control during the occurrence of noise and data signals, a capacitor (C12) in such a way that, with few of said input signals exceeding a threshold level and a correspondingly small charge, the gain sensitivity is raised, and with many digital input signals exceeding a threshold level and a correspondingly large charge the gain sensitivity is reduced again, depending on said output signal from said signal detector (PC), a means for generating said discharge pulse (EP) and thereafter causing the charge transferred to the capacitor (C12) by the data signal to be removed again;

the input amplifier and filter stage circuitry are connected to an automatic gain control (AGC) and a signal detector (PC), whereby the signal detector (PC) is connected to both a pulse former stage (PF) and a noise suppression circuit (NS), and whereby the input to the automatic gain control (AGC) and the output of the noise suppression circuit (NS) are connected to said capacitor (C12), a first diode (D1), whose anode is connected to a voltage source and whose cathode is connected on one hand to a current source (Q4) and on the other hand with the cathode of a second diode (D2), whose anode is connected to said capacitor (C12), such that:

in a rest state a larger voltage is present at the cathode of the diode (D2), so that the capacitor (C12) cannot be discharged; and when a discharge pulse (EP) appears, the voltage at the cathode of said diode (D2) is lowered to a value smaller than the voltage on the capacitor (C12), so that the capacitor is discharged.

\* \* \* \* \*

UNITED STATES PATENT AND TRADEMARK OFFICE
CERTIFICATE OF CORRECTION

PATENT NO. : 5,600,681
DATED : February 4, 1997
INVENTOR(S) : Max B. Gut

It is certified that error appears in the above-indentified patent and that said Letters Patent is hereby corrected as shown below:

Column 2:

Please delete lines 1 and 2.

In the Claims:

Claim 10:

Column 11, line 10, please delete "satire" and substitute --same--.

Signed and Sealed this

Twentieth Day of May, 1997

Attest:

BRUCE LEHMAN

Attesting Officer　　　Commissioner of Patents and Trademarks